(12) United States Patent
Webster et al.

(10) Patent No.: US 7,554,184 B2
(45) Date of Patent: Jun. 30, 2009

(54) IMAGE SENSOR CHIP PACKAGE

(75) Inventors: Steven Webster, Miao-li (TW); Ying-Cheng Wu, Miao-li (TW)

(73) Assignee: Altus Technology Inc., Chu-Nan, Miao-Li Hsien (TW)

( * ) Notice: Subject to any disclaimer, the term of this patent is extended or adjusted under 35 U.S.C. 154(b) by 344 days.

(21) Appl. No.: 11/448,570

(22) Filed: Jun. 7, 2006

(65) Prior Publication Data
US 2007/0023608 A1 Feb. 1, 2007

(30) Foreign Application Priority Data
Jul. 15, 2005 (CN) .......................... 2005 1 0036034

(51) Int. Cl.
*H01L 23/02* (2006.01)
*H01L 23/48* (2006.01)
(52) U.S. Cl. .................. 257/680; 257/696; 257/774; 257/E23.002; 257/E23.151
(58) Field of Classification Search ................. 257/680, 257/696, 774, E23.002, E23.151
See application file for complete search history.

(56) References Cited
U.S. PATENT DOCUMENTS

| | | | | |
|---|---|---|---|---|
| 5,034,800 A | * | 7/1991 | Marchisi | ........................ 257/695 |
| 5,343,076 A | * | 8/1994 | Katayama et al. | ............ 257/717 |
| 6,048,754 A | * | 4/2000 | Katayama et al. | ............ 438/115 |
| 6,313,525 B1 | * | 11/2001 | Sasano | ........................ 257/704 |
| 6,649,834 B1 | * | 11/2003 | Hsieh et al. | .................. 174/527 |
| 6,661,103 B2 | * | 12/2003 | Akram | ........................ 257/787 |
| 6,835,960 B2 | * | 12/2004 | Lin et al. | ........................ 257/81 |
| 6,956,283 B1 | * | 10/2005 | Peterson | ...................... 257/680 |
| 7,199,400 B2 | * | 4/2007 | Sasuga | ........................ 257/81 |
| 2003/0232461 A1 | * | 12/2003 | Bolken et al. | ................ 438/106 |
| 2004/0245530 A1 | * | 12/2004 | Kameyama et al. | ............ 257/80 |
| 2005/0009239 A1 | * | 1/2005 | Wolff et al. | .................. 438/123 |
| 2006/0202210 A1 | * | 9/2006 | Mok et al. | ...................... 257/79 |

\* cited by examiner

*Primary Examiner*—Ngan Ngo
(74) *Attorney, Agent, or Firm*—Andrew C. Cheng

(57) ABSTRACT

A chip package (200) includes a carrier (20), a chip (22), a second conductive means (26) and a transparent cover (28). The carrier (20) includes a base (24). The chip is mounted on the base and has an active area (222). The second conductive means electronically connects the chip with the conductive means. The first adhesive means is applied around the active area of the chip. The transparent cover is mounted to the base of the carrier. The cover is adhered with the first adhesive means so as to define a sealing space (32) for sealing the active area of the chip therein. It can be seen that the active area of the chip is sufficiently protected from pollution by the small volume of the sealing space.

19 Claims, 2 Drawing Sheets

IMAGE SENSOR CHIP PACKAGE

BACKGROUND OF THE INVENTION

1. Field of the Invention

This application is related to a U.S. patent applications Ser. No. 11/448,314, entitled "IMAGE SENSOR CHIP PACKAGE", by Steven Webster et al. Such application has the same assignee as the instant application and has been concurrently filed herewith. The disclosure of the above identified applications is incorporated herein by reference.

2. Discussion of the Related Art

Image sensors are widely used in digital camera modules in order to convert the optical image data of an object into electrical signals. In order to protect the image sensor from contamination or pollution (i.e. from dust or water vapor), the image sensor is generally sealed in a structural package.

A typical image sensor chip package (not labeled) is illustrated in FIG. 1. The image sensor chip package is constructed to include a plurality of conductors 130, a base 146, a chip 152 and a cover 158. The base 146 includes a bottom portion 1462 and four sidewalls 1464. The bottom portion 1462 and the sidewalls 1464 cooperatively form a space 150. Each conductor 130 includes a first conductive portion 132, a second conductive portion 134 and a third conductive portion 136. Each of the first and second conductive portions 132, 134 is mounted on one side of the bottom portion 1462 separately. The third conductive portion 136 runs through the bottom portion 1462 so as to connect the first and second conductive portions 132, 134. A plurality of pads 1522 are formed on the chip 152. The chip 152 is received in the space 150 and fixed on the base 146 by an adhesive glue 160. A plurality of bonding wires 156 are provided to connect the pads 1522 and the first conductive portion 132 of the conductors 130. The cover 158 is transparent and secured to the top of the sidewalls 1464 via an adhesive glue 162, thereby hermetically sealing the space 150 and allowing light beams to pass therethrough.

In the process of forming the conductors 130, a plurality of interconnection holes 166 are defined in the bottom board 1462. Then the third portions 136 are formed by plating so as to fill the interconnection holes 166. It is obvious that the method of forming the conductors 130 is complex and the cost is high. Furthermore, after the conductors 130 are formed, water vapor can enter the space 150 via the interconnection holes 166. Thus, the chip 152 will be polluted and the conductors 130 will be damaged.

In addition, the relative large volume of the image sensor chip package results in more dust-particles adhering to the cover 158, the bottom board 1462 and the sidewalls 1464 of the base 146. Thus, more dust-particles will drop onto the chip 152. The dust-particles obscure the optical path and produce errors in the image sensing process. Accordingly, the quality and/or reliability of the image sensor chip package can be effected.

Moreover, the bonding wires 156 exposed in the space 150 lack protection, thus are easy to be damaged by dust-particles in the space 150.

What is needed, therefore, is an image sensor chip package with reliability and high image quality.

SUMMARY OF THE INVENTION

A chip package includes a carrier, a chip, a second conductive means and a transparent cover. The carrier includes a base and a first conductive means. The chip is mounted on the base and has an active area. The second conductive means electronically connects the chip with the first conductive means. The first adhesive means is applied around the active area of the chip. The transparent cover is mounted to the base of the carrier. A middle circular area of the cover is adhered with the first adhesive means so as to define a sealing space for sealing the active area of the chip therein. The transparent cover is mounted to the base of the carrier. The cover is adhered with the first adhesive means so as to define a sealing space for sealing the active area of the chip therein.

Other advantages and novel features will become more apparent from the following detailed description when taken in conjunction with the accompanying drawings.

BRIEF DESCRIPTION OF THE DRAWINGS

Many aspects of the present image sensor chip package can be better understood with reference to the following drawings. The components in the drawings are not necessarily drawn to scale, the emphasis instead being placed upon clearly illustrating the principles of the image sensor chip package. Moreover, in the drawings, like reference numerals designate corresponding parts throughout the several views.

DETAILED DESCRIPTION OF THE PREFERRED EMBODIMENTS

Figure 1:
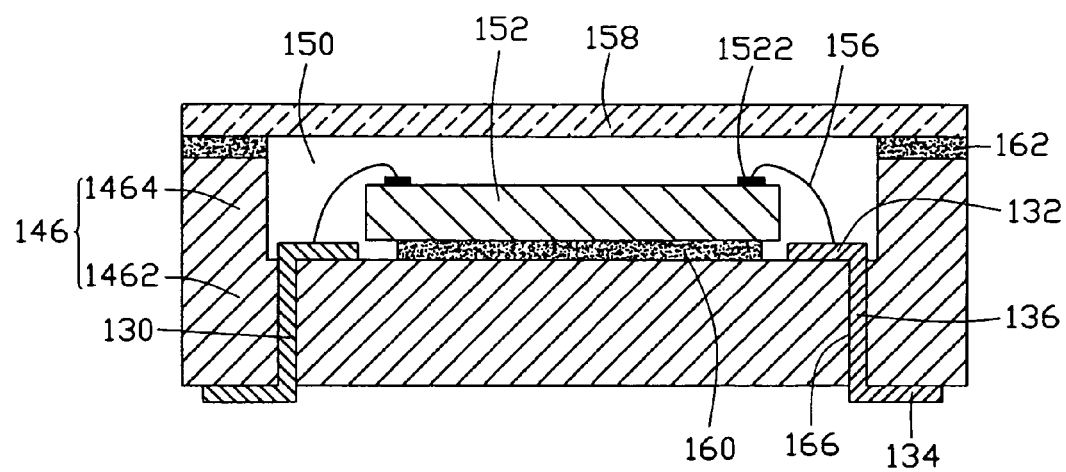
FIG. 1 is a schematic, cross-sectional view of a typical image sensor chip package.
Figure 2:
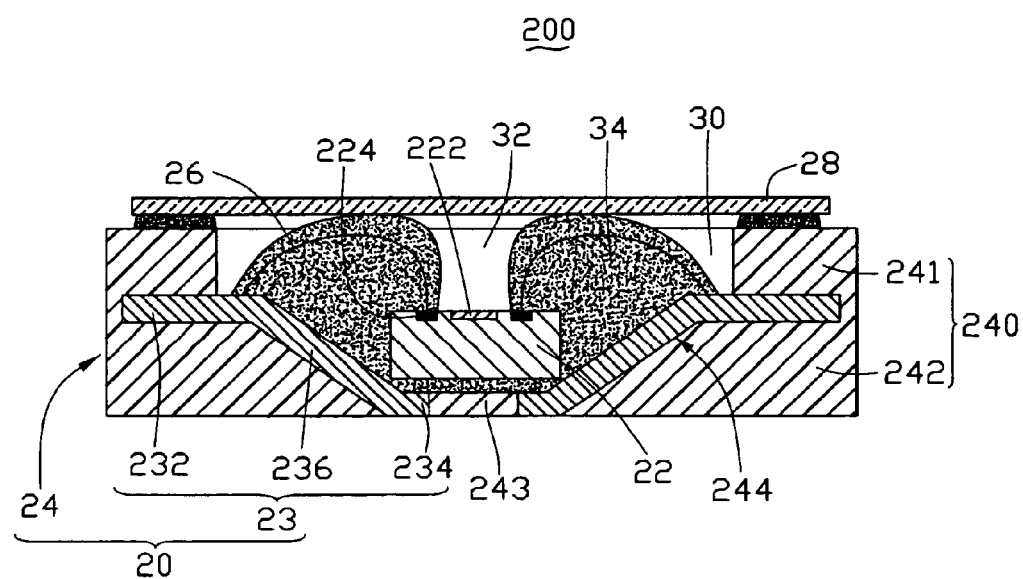
FIG. 2 is a schematic, cross-sectional view of an image sensor chip package according to a preferred embodiment.

Referring to FIG. 2, an image sensor chip package 200 in accordance with a preferred embodiment is shown. The image sensor chip package 200 includes a carrier 20, a chip 22, a plurality of bonding wires 26 and a cover 28. The carrier 20 includes a leadframe 23 and a base 24. The leadframe 23 and the base 24 cooperatively form the carrier 20 by insert-molding.

Figure 3:
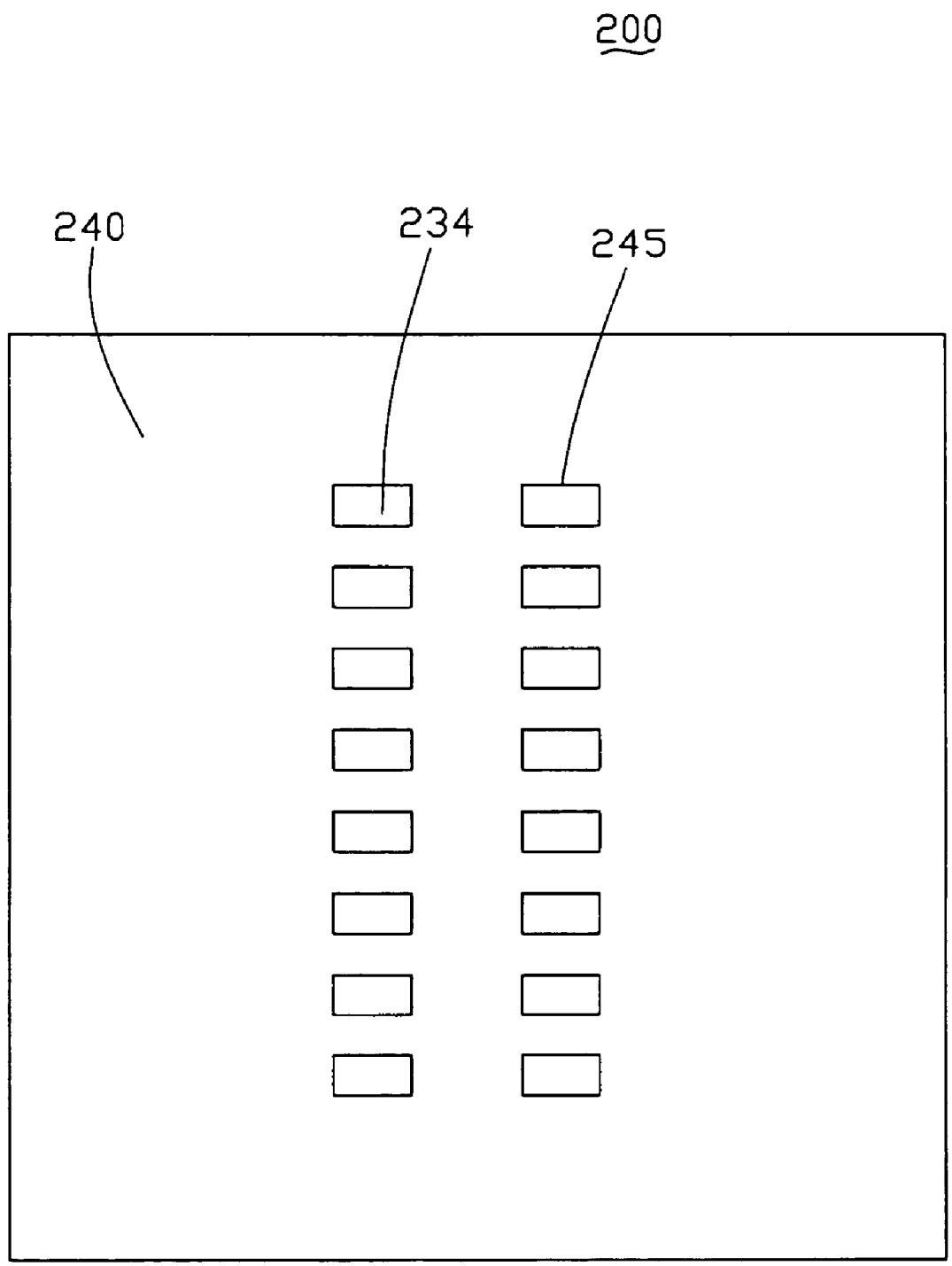
FIG. 3 is a schematic, bottom view of the image sensor chip package in FIG. 2.

The base 24 is made of plastic material and is cuboid-shaped. The base 24 includes four sidewalls 240 and a bottom board 243 for cooperatively forming a cavity 30 therebetween. Each of the sidewalls 240 includes a top portion 241 and a bottom portion 242. Two opposite sidewalls 240 each define a plurality of slots (not labeled) which are parallel to and spaced from each other between the top portion 241 and the bottom portion 242. A slanted surface 244 slanted to the bottom surface of the bottom board 243 is formed on each of the two opposite sidewalls 240. The slanted surfaces 244 face the cavity 30. Referring to FIG. 3, the bottom board 243 defines two symmetrical groups of openings 245. Each group has a plurality of openings 245 which are parallel to and spaced from each other corresponding to the slots of one of the sidewalls 240.

The leadframe 23 includes a plurality of conductive pieces made of metal. Each of the conductive pieces includes a first portion 232, a second portion 234 and a third portion 236 connecting the first portion 232 with the second portion 234. The first and second portions 232, 234 are spaced apart and aligned in parallel to each other. The third portion 236 is slanted relative to the first and second portions 232, 234. One end of the first portion 232 is connected to one end of the third portion 236, and one end of the second portion 234 is connected to the other end of the third portion 236. The first portions 232 are received in the corresponding slots of the sidewalls 240, the second portions 234 are received in the corresponding openings 245 of the bottom board 243, and the third portions 236 are supported by the slanted surface 244. Correspondingly, the conductive pieces are divided into two groups. The two groups are symmetrically arranged and the conductive pieces in the same group are parallel to and spaced from each other. One end of the second portions 234 is exposed via the openings 245, thus a plurality of bottom pads (not labeled) are formed. The bottom pads are connected to a printing circuit board (PCB), for electronically connecting the leadframe 23 to the PCB so as to transmit electric signals out of the image sensor chip package 200. The leadframe 23 is formed by either punching or etching on a metal sheet.

The image sensor chip 22 is adhered to the top surface of the bottom board 243 of the base 23 via an adhesive glue 34. A top side of the image sensor chip 22 is arranged with an photosensitive area 222 and a plurality of chip pads 224 around the photosensitive area 222. The adhesive glue 34 can be replaced by any other appropriate adhesive means.

The bonding wires 26 are made of a conductive material such as gold or aluminum alloy. One end of each wire 26 is connected/joined with one respective chip pad 224 of the image sensor chip 22, and the other end of the wire 26 is connected/joined with one respective first portion 232 of the leadframe 23.

The cover 28 is transparent and is laid over the image sensor chip 22 which receives light beams transmitted through the cover 28. The two ends of the cover 28 are adhered on the base 24 by glue (not labeled) and therefore seal the image sensor chip 23 in the cavity 30 of the base 24.

The adhesive glue 34, such as a silicone, epoxy, acrylic, or polyamide adhesive, is applied to the chip pads 224 adjacent to the photosensitive area 222 of the image sensor chip 22. The adhesive glue 34 covers all of the bonding wires 26 so as to enclose the photosensitive area 222. The adhesive glue 34 covers the first and third portions 232, 236, and the top surface of the bottom board 243. The adhesive glue 34 also fixes a substantially middle ring area of the cover 28 and defines a small sealing space 32 configured to seal the photosensitive area 222 therein. The bonding wires 26 and the adhesive glue 34 are received in the cavity 30. It can be seen that the photosensitive area 222 of the image sensor chip 22 is sufficiently protected from outside pollution due to the small volume of the sealing space 32. The bonding wires 26 are protected by the adhesive glue 34 and the leadframe 23 is protected by the base 24. Understandably, the adhesive glue 34 may cover one portion of all the wires adjacent to the photosensitive area as long as the sealing space 32 may be formed.

In an alternative embodiment, the arrangement of the conductive pieces of the leadframe 23 can be changed so long as the conductive pieces are spaced from each other. The third portion 236 can be perpendicular to the first and second portions 232, 234 rather than slanted. The base 24 can be of another shape such as cylinder-shaped, or column-shaped with pentagonal or hexagonal cross-section.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. An image sensor chip package comprising:
   a carrier comprising a base and a leadframe, the base having a cavity therein, the leadframe comprising a plurality of conductive pieces, the conductive pieces of the leadframe being embedded in the base and spaced from each other;
   an image sensor chip mounted on the base and received in the cavity, the image sensor chip having a photosensitive area and a plurality of chip pads around the photosensitive area;
   a plurality of wires each electronically connecting one corresponding chip pad of the image sensor chip and one corresponding conductive piece of the carrier;
   an adhesive means applied to the chip pads around the photosensitive area and covering at least one portion of all the wires adjacent to the photosensitive area; and
   a transparent cover mounted to the carrier, the adhesive means adhering to a substantially middle area of the transparent cover, the adhesive means with the middle area of the transparent cover enclosing the photosensitive area.

2. The image sensor chip package as claimed in claim 1, wherein the each of the conductive pieces of the leadframe comprises a first portion, a second portion and a third portion, the first and second portions are parallel to and spaced from each other, the third portion is slanted relative to the first and second portions, one end of the first and second portions are each connected to their respective separate ends of the third portion.

3. The image sensor chip package as claimed in claim 2, wherein the base comprises a plurality of sidewalls and a bottom board for cooperatively fanning the cavity, each 4. The image sensor chip package as claimed in claim 3, wherein the first portions are received in the slots of the sidewalls, the second portions are received in the openings of the bottom board, and the third portions is supported by the slanted surface.

5. An image sensor chip package comprising:
   a carrier comprising a conductive means and a base, the conductive means forming a plurality of pads outside the base;
   an image sensor chip mounted on the base, the image sensor chip having a photosensitive area and a plurality of chip pads around the photosensitive area;
   a plurality of wires each electronically connecting one of the chip pads of the image sensor chip and the conductive means;
   a first adhesive means applied around the photosensitive area of the image sensor chip; and
   a transparent cover mounted to the base of the carrier, the first adhesive means covering all the wires and adhered to an area of the cover opposing to the image sensor chip so as to define a sealing space therebetween, thereby sealing the photosensitive area of the image sensor chip therein.

6. The image sensor chip package as claimed in claim 5, wherein the base of the carrier has a cavity therein, the conductive means comprises a plurality of conductive pieces embedded in the base and spaced from each other.

7. The image sensor chip package as claimed in claim 6, wherein the leadframe is manufactured by punching or etching on a metal sheet, the base is made of plastic materials.

8. The image sensor chip package as claimed in claim 6, wherein the carrier is manufactured by insert-molding.

9. The image sensor chip package as claimed in claim 6, wherein each of the conductive pieces of the conductive means comprises a first portion, a second portion and a third portion, the first and second portions are parallel to and spaced from each other, the third portion is slanted relative to the first and second portions, one end of the first and second portions are each connected to their respective separate ends of the third portion.

10. The image sensor chip package as claimed in claim 9, wherein the base comprises a plurality of sidewalls and a bottom board for cooperatively forming the cavity, each of the sidewalls includes a top portion and a bottom portion, two opposite sidewalls each defines a plurality of slots which are parallel to and spaced from each other between the top portion and the bottom portion, a slanted surface is formed on each of the two opposite sidewalls, the slanted surfaces face the cavity, the bottom board defines a plurality of openings corresponding to the slots.

11. The image sensor chip package as claimed in claim 10, wherein the first portions are received in the slots of the sidewalls, the second portions are received in the openings of the bottom board, and the third portions is supported by the slanted surface.

12. A chip package comprising:
a carrier comprising a first conductive means and a base;
a chip mounted on the base, the chip having an active area;
a second conductive means electronically connecting the chip with the first conductive means;
a first adhesive means applied around the active area of the chip; and
a transparent cover mounted to the base of the carrier, a middle ring area of the cover adhered with the first adhesive means so as to define a sealing space for sealing the active area of the chip therein.

13. The chip package as claimed in claim 12, wherein the first conductive means forming a plurality of pads outside the base, the chip has a plurality of chip pads around the active area, the second conductive means has a plurality of wires each connecting one pad of first conductive means to one corresponding chip pad of the chip.

14. The chip package as claimed in claim 12, further comprising a second adhesive means, the second adhesive means is adhered to two ends of the transparent cover.

15. The chip package as claimed in claim 12, wherein the first adhesive means covers all the wires, the adhesive means with the middle ring area of the cover encloses the sealing space.

16. The image sensor chip package as claimed in claim 1, wherein the adhesive means covers all the wires, and the adhesive means adheres to a substantially middle ring area of the transparent cover.

17. The image sensor chip package as claimed in claim 16, wherein the base includes a bottom board with a top surface, each of the conductive pieces of the leadframe comprises a first portion, a second portion and a third portion, the adhesive glue covers all of the bonding wires and the first and third portions, and the top surface of the bottom board.

18. The image sensor chip package as claimed in claim 5, further comprising a second adhesive means, the second adhesive means is adhered to two end of the transparent cover.

19. The image sensor chip package as claimed in claim 5, wherein the first adhesive means adheres to a middle ring area of the cover opposing to the image sensor chip.

* * * * *